United States Patent
Rutten et al.

(10) Patent No.: US 9,906,384 B1
(45) Date of Patent: Feb. 27, 2018

(54) MULTIPLE-TAP COMPENSATION AND CALIBRATION

(71) Applicant: NXP B.V., Eindhoven (NL)

(72) Inventors: Robert Rutten, Nistelrode (NL); Lucien Johannes Breems, Eindhoven (NL); Johannes Hubertus Antonius Brekelmans, Nederweert (NL); Jan Niehof, Waalre (NL); Muhammed Bolatkale, Eindhoven (NL); Shagun Bajoria, Eindhoven (NL)

(73) Assignee: NXP B.V., Eindhoven (NL)

( * ) Notice: Subject to any disclaimer, the term of this patent is extended or adjusted under 35 U.S.C. 154(b) by 18 days.

(21) Appl. No.: 15/275,968

(22) Filed: Sep. 26, 2016

(51) Int. Cl.
   *H04L 25/03* (2006.01)

(52) U.S. Cl.
   CPC ............. *H04L 25/03885* (2013.01); *H04L 2025/0349* (2013.01); *H04L 2025/03808* (2013.01)

(58) Field of Classification Search
   CPC ........... H04L 27/3863; H04L 5/0007; H04L 2025/03617; H04L 27/3872; H04B 1/30; H04B 1/123; H04B 10/6971; H04B 17/11; H04B 1/0017
   USPC ........................................ 375/229–233, 350
   See application file for complete search history.

(56) References Cited

U.S. PATENT DOCUMENTS

| | | | |
|---|---|---|---|
| 2005/0152481 A1* | 7/2005 | Lin | H03D 3/009 375/346 |
| 2007/0202825 A1* | 8/2007 | Park | H04B 17/21 455/226.1 |
| 2008/0089443 A1* | 4/2008 | Sanada | H04L 27/2675 375/319 |
| 2008/0112519 A1* | 5/2008 | Jung | H04B 1/0032 375/350 |
| 2011/0069744 A1* | 3/2011 | Laudel | H04B 1/0032 375/219 |
| 2012/0026039 A1* | 2/2012 | Ganeshan | G01S 19/33 342/357.73 |
| 2013/0266102 A1* | 10/2013 | Yan | H04B 1/10 375/350 |
| 2014/0029700 A1* | 1/2014 | Viswanathan | H03D 3/009 375/324 |

(Continued)

FOREIGN PATENT DOCUMENTS

WO    WO2014018303 A1    1/2014

OTHER PUBLICATIONS

A.M.J.M. Schoonen, "Estimation Methods for IQ Imbalance in Multi-Standard (Near) Zero IF Receivers", NXP Semiconductors, Eindhoven University of Technology, Version: 1.0.0, May 7, 2009.

(Continued)

*Primary Examiner* — Emmanuel Bayard
(74) *Attorney, Agent, or Firm* — Rajeev Madnawat

(57) ABSTRACT

Corrections are provided for mismatches between an in-phase (I) signal and a quadrature-phase (Q) signal, the I and Q signals having a first frequency band. A frequency filter circuit filters the I and Q signals to produce a filtered I and Q output with a second frequency band that is a subset of the first frequency band. Digital circuitry includes a multiple-tap correction filter having a plurality of taps and configured to generate I and Q output signals by filtering the I and Q signals according to respective sets of coefficients for the plurality of taps. A coefficient estimator generates the sets of coefficients relative to different frequency bands.

20 Claims, 8 Drawing Sheets

(56) References Cited

U.S. PATENT DOCUMENTS

2015/0200628 A1   7/2015  Rutten et al.
2015/0333783 A1*  11/2015  Abe .................. H03H 17/0213
                                                          375/285

OTHER PUBLICATIONS

Windisch, Marcus, and Gerhard Fettweis. "Blind estimation and compensation of I/Q imbalance in OFDM receivers with enhancements through Kalman filtering." 2007 IEEE/SP 14th Workshop on Statistical Signal Processing. IEEE, 2007.

Valkama, Mikko, Markku Renfors, and Visa Koivunen. "Advanced methods for I/Q imbalance compensation in communication receivers." IEEE Transactions on Signal Processing 49.10 (2001): 2335-2344.

* cited by examiner

MULTIPLE-TAP COMPENSATION AND CALIBRATION

OVERVIEW

Aspects of various embodiments are directed to the use of calibration of a multiple-tap compensation circuit.

Radio frequency (RF) circuits are often designed to use an encoding scheme in which the transmitted RF signal includes In-phase (I) and Quadrature-phase (Q) components. The receiver circuit mixes a received RF signal with a sine and cosine wave, producing separate I and Q signals. The receiver circuit might also use heterodyning to produce an intermediate frequency (IF) signal that is further processed by amplifiers, filters and Analog-to-Digital Converters (ADCs).

These and other matters have presented challenges to circuits providing signal communications and related implementations, for a variety of applications.

SUMMARY

Various example embodiments are directed to issues such as those addressed above and/or others which may become apparent from the following disclosure concerning compensating for IQ mismatches.

In certain example embodiments, aspects of the present disclosure involve compensating for IQ mismatches that exhibit frequency dependence.

Consistent with various embodiments, an apparatus corrects for mismatches between an in-phase (I) signal and a quadrature-phase (Q) signal, the I and Q signals having a first frequency band. The apparatus includes a frequency filter circuit configured to filter the I and Q signals to produce a filtered I and Q output with a second frequency band that is a subset of the first frequency band. The apparatus also includes digital circuitry, which includes a multiple-tap correction filter having a plurality of taps and configured to generate I and Q output signals by filtering the I and Q signals according to respective sets of coefficients for the plurality of taps. The digital circuitry also includes a coefficient estimator configured to generate, from the I and Q signals having the first frequency band, a first set of coefficients for the sets of coefficients; and generate, from the filtered I and Q signals having the second frequency band, second and third sets of coefficients for the sets of coefficients.

Various embodiments are directed toward a method involving the receipt of an in-phase (I) signal and a quadrature-phase (Q) signal having a first frequency bandwidth. A multiple-tap correction filter having a plurality of taps is used to correct mismatches in the I and Q signals by filtering the I and Q signals according to sets of coefficients for the plurality of taps. The I and Q signals are filtered to produce filtered I and Q signals having a second frequency band that is a subset of the first frequency band. The multiple-tap correction filter is used to correct mismatches in the filtered I and Q signals by filtering the filtered I and Q output according to the respective sets of coefficients. The corrected I and Q signals having the first frequency bandwidth are used to generate a first set of coefficients for the sets of coefficients. The corrected I and Q signals having the second frequency bandwidth are used to generate second and third sets of coefficients for the sets of coefficients.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
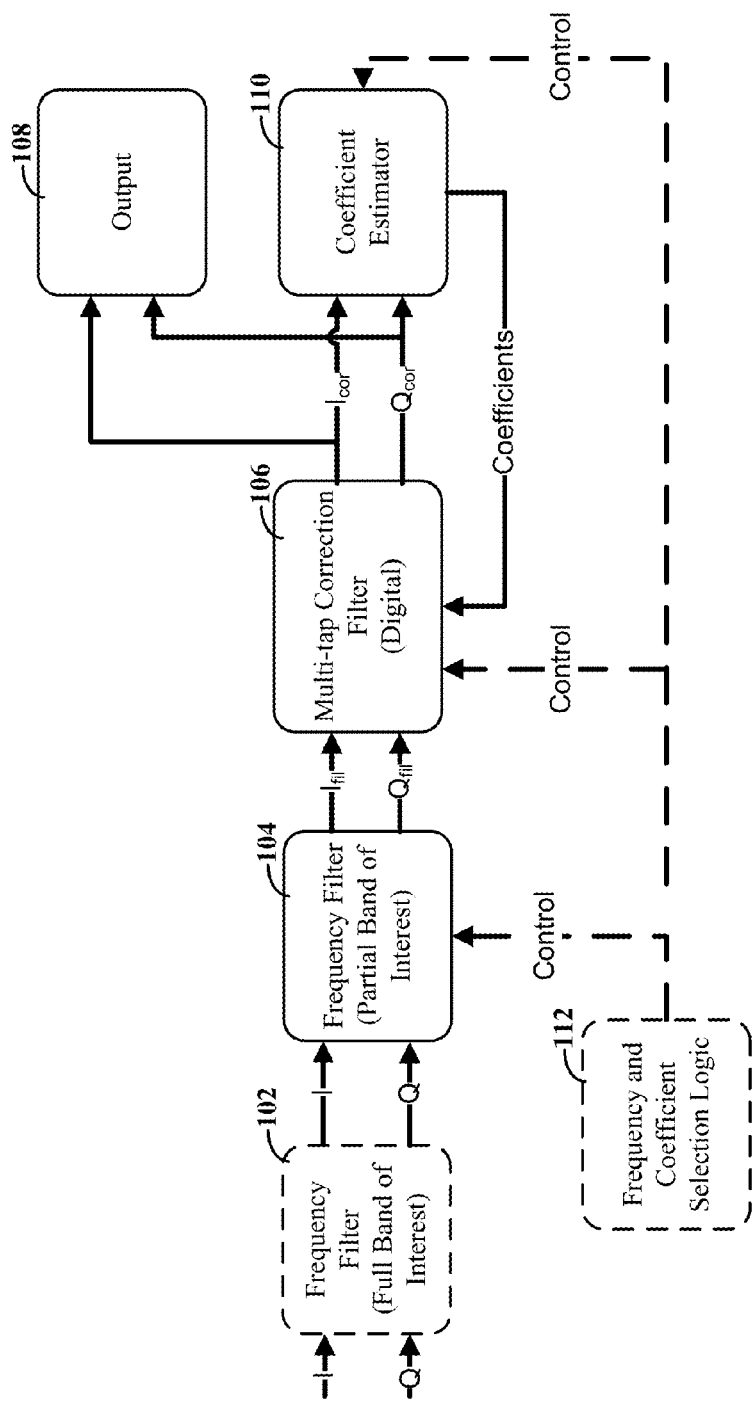
FIG. 1 is a block diagram of apparatus that corrects for mismatches between I and Q signals, consistent with embodiments of the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving filtering by RF receiver circuits. In certain implementations, aspects of the present disclosure have been shown to be beneficial when used in the context of multiple-tap filters to compensate for errors due to mismatches between I and Q signal components. In some embodiments, a multiple-tap filter can provide image filtering that compensates for I and Q mismatches that vary over a desired frequency bandwidth. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Various embodiments of the present disclosure are directed toward a multiple-tap frequency filter and toward finding sets of coefficients for the multiple-tap frequency filter. In particular implementations, the coefficients are set to compensate for frequency dependency in I and Q mismatches, relative to a frequency band of interest.

Elements like mixers, IF filters, amplifiers and ADCs can introduce an amplitude and phase difference between I and Q paths. Ideally, the amplitude for the I path should be the same as the amplitude for the Q path (accounting for differences due to modulation). Further, the phase between I and Q paths should be 90°. Deviations from the ideal situation degrade Image Rejection (IR) performance. IR can be improved by applying a digital correction algorithms. Aspects of the present disclosure are directed toward implementations in which the amplitude and phase errors exhibit non-trivial frequency dependence over a signal bandwidth of interest. Various embodiments are directed toward compensation that considers frequency dependence of the amplitude and phase errors between I and Q paths.

Various embodiments are directed toward generating tap coefficients for a multiple-tap finite-impulse response (FIR) filter that corrects for IQ mismatch or imbalance. Each set of tap coefficients corresponds to a respective tap and includes a phase component and gain component. According to particular implementations, the output of the multiple-tap filter is connected to a coefficient estimator that generates a first set of tap coefficients in response to IQ mismatches in the received IQ signals and relative to the entire frequency band of interest. The first set of coefficients is used to update a tap of the multiple-tap filter. The updating occurs as part of a feedback loop that attempts to minimize undesired signal image caused by the IQ mismatch relative to the entire frequency band of interest. By implementing minimization relative to the entire frequency band, the compensation can be less effective at certain frequencies (e.g., for frequencies near the edges of the frequency band of interest).

To improve compensation across the frequency band of interest, additional sets of tap coefficients are generated for use by the multiple-tap filter. Consistent with particular embodiments, the additional sets of tap coefficients are generated by applying a frequency filter to the IQ signals to produce IQ signals that have a frequency band that is a subset of the IQ entire frequency band, which was used to generate the first set of coefficients for the first tap. The resulting additional sets of tap coefficients are thereby targeted at minimizing undesired signal images caused by the IQ mismatch relative to a sub band of the entire frequency band of interest. The combination of the multiple sets of tap coefficients can be particularly useful for compensating for frequency dependency with IQ mismatches.

According to particular embodiments of the present disclosure, the coefficient estimator(s) are configured to generate the sets of tap coefficients using a relatively computationally simple algorithm (e.g., without the need for a computationally intensive inverse fast Fourier transform). For instance, the coefficient estimator can use a combination of relatively simple functions (e.g., adders, multipliers and integrators) to generate phase and gain components of the tap coefficients.

Certain aspects of the present disclosure relate to the recognition that proper optimization of the first set of tap coefficients (based upon the entire signal band of interest) leads to an average error that is zero. This can occur due to residual error remaining, but being cancelled out by the coefficient estimator and feedback loop (e.g., when the system operates as a closed loop with an integrator in the feedback path). It has been further recognized that, for image components caused by IQ mismatch, the residual error can be (near) zero at a center point for the entire band of interest. The result is that the phase and amplitude errors on either side of the center point cancel each other out because they have equal magnitudes and opposites signs. Accordingly, certain embodiments are directed toward the use of a single coefficient estimator to produce coefficients for two different sets of tap coefficients, each set corresponding to a respective side of the center point. For example, a bandpass filter can be used to filter half of the entire frequency band of interest (on either side of the center point). A set of coefficients generated for this sub band can be used for taps on respective sides of a center tap of the multiple-tap filter.

Turning now to the figures, FIG. 1 is a block diagram of apparatus that corrects for mismatches between I and Q signals, consistent with embodiments of the present disclosure. The apparatus of FIG. 1 can be implemented as part of a receiver or transceiver circuit that can perform various pre-processing of a received RF signal to produce the depicted I and Q signals. For example, the preprocessing can include mixing a received RF signal with reference signals that are 90 degrees out of phase (e.g., sine and cosine wave) to produce separate I and Q signals. The receiver circuit might also use heterodyning to shift the frequency of the RF signal to produce an intermediate frequency (IF) signal. In certain embodiments, the signal processing can include the use of a frequency filter 102 that filters out frequencies outside of the full frequency band of interest. As a non-limiting example, frequency filter 102 can be a surface acoustic wave (SAW) filter. The frequency filter 102 is optional and not required for each implementation.

A frequency filter 104 filters the I and Q signals relative to a sub band of the full frequency band of interest. As discussed herein, particular embodiments are directed toward the frequency filter 104 being configured to filter half of the full frequency band of interest. For example, if the full frequency band of interest is based upon a modulated signal at 10 MHz (IF) and having a bandwidth of 1.53 MHz, then the frequency filter can be implemented as a bandpass filter for either 9.232 MHz to 10 MHz or 10 MHz to 10.768 MHz. The frequency filter 104 can be implemented in either the analog realm or the digital realm.

The output of the frequency filter 104 is provided to a multiple-tap correction filter 106. The multiple-tap correction filter 106 compensates for image components resulting from IQ mismatches, which can be caused by mismatches in the preprocessing and filtering of the RF signal and the IQ signals generated therefrom. The output of the multiple-tap correction filter 106 ($I_{cor}$ and $Q_{cor}$) is provided as an output 108, which can be used to decode data that was encoded within the RF signal. The output of the multiple-tap correction filter 106 is also provided to the coefficient estimator 110, which generates sets of coefficient values for the taps of the multiple-tap correction filter 106. The resulting feedback loop converges to minimize the image error in the IQ signals.

The operation of the multiple-tap correction filter 106 is defined by sets of coefficients that each configure a corresponding tap. The apparatus of FIG. 1 sets of coefficients set to compensate for frequency dependence of the IQ mismatch. This can be accomplished by generating a first set of coefficients from the full frequency band of interest and additional (second and third) sets of coefficients from a partial sub band of the fully frequency band of interest. In order to create these different sets of coefficients, the coefficient estimator receives two version of the corrected IQ signals. The first version is generated by applying the correction filtering to IQ signals containing the full frequency band of interest. The second version is generated by applying the same correction filtering to IQ signals that have had a portion of the full frequency band filtered out (e.g., ½ of the full frequency band has been removed from the IQ signals before correction filtering).

According to certain embodiments of the present disclosure, the IQ signal correction filtering of the respective frequency bands (e.g., full and half) is accomplished using the same multiple-tap correction filter 106. For example, frequency and coefficient selection logic 112 can be configured to select between the respective frequency bands. When the full frequency band is selected, the selection logic 112 can disable or bypass frequency filter 104. As an alternative to completely bypassing or disabling the frequency filter 104, the bandwidth of the frequency filter 104 could be adjusted so as not to filter out frequencies within the full band of interest. The output of the multiple-tap correction filter 106 can then be provided both to the output 108 and the coefficient estimator 110. The set of coefficients generated by the coefficient estimator 110 can be used to update a first tap of multiple-tap correction filter 106. As discussed herein, this first tap can correspond to the center tap of a multiple-tap correction filter 106 with an odd number of taps.

When the sub (half) frequency band is selected, the selection logic 112 can enable frequency filter 104 so that the multiple-tap correction filter 106 receives only a portion of the full IQ signal. The output of the multiple-tap correction filter 106 can then be provided to the coefficient estimator 110. The selection logic 112 can prevent the output of the multiple-tap correction filter 106 from being provided to the output 108. In particular, the multiple-tap correction filter 106 output represents only a portion of the full IQ signal. The resulting signal may still contain residual errors that can make proper decoded difficult or impossible. The set of coefficients generated by the coefficient estimator 110 can be used to update additional taps of multiple-tap correction filter 106. As discussed herein, the additional tap can correspond to taps on either side of the center tap of a multiple-tap correction filter 106 (e.g., taps one and three in a three-tap filter). According to embodiments, the coefficient estimator 110 can use the same coefficient value for each of the corresponding taps. The selection logic 112 can control which tap(s) the output of the coefficient estimator 110 is used to update based upon the corresponding setting for the frequency filter 104.

According to various embodiments, frequency filter 104, multiple-tap correction filter 106, the coefficient estimator 110, and selection logic 112 are implemented in the digital realm using a processor circuit and a memory circuit. An ADC can be located before the frequency filter 104 to produce digital data representing the IQ signals. As an example, a digital signal processor (DSP) chip can be programmed to implement the frequency filter 104, multiple-tap correction filter 106, the coefficient estimator 110, and selection logic 112. In this context, the reuse of the multiple-tap correction filter 106 and the coefficient estimator 110 for the different frequency bands represents as time-interleaving of the processing time for implementing relative to the corresponding frequency band. For example, a DSP could implement an initialization phase before data is decoded. During the initializing phase, values for the first set of coefficients can first be determined relative to the entire frequency band of interest. Once the values have settled for the first set of coefficients, the DSP enables the frequency filter 104 and obtains the second set of coefficients relative to a subset of the frequency band of interest. At the completion of the initialization phase, the DSP disables the frequency filter 104 and the data encoded in the IQ signals can be decoded.

According to certain embodiments, the DSP may also update the second set of coefficients at subsequent points of operation. Different triggering events can be used to determine when the values are updated. For example, the communication protocol may have periods during which data is not actively being transmitted. The DSP can use these periods to update the values for the second set of coefficients. The DSP might also periodically perform updates. As another example, the system could be configured to update the values in response to detecting errors in the decoded data (e.g., in response to a bit error rate exceeding a threshold value). These and other triggering events can be used alone or in various combinations.

According to certain embodiments, the system is configured to update the second set of coefficients while simultaneously providing corrected IQ signals for decoding. In particular, the full frequency band IQ signal is corrected by a multiple-tap correction filter 106 at the same time as the sub frequency band IQ signal is corrected by a multiple-tap correction filter 106. The corrected outputs are each provided to a coefficient estimator 110 to generate the corresponding sets of coefficients. The effect is two parallel processing paths for the same IQ signal. The parallel nature of the processing paths is understood in the context of the relative timing of the IQ signals being processed, and is not limited to simultaneous processing time within separate circuits (e.g., the same processor circuit(s) of a DSP could be used to implement each path using time-interleaving).

For ease of discussion various embodiments are discussed in the context of a three-tap correction filter. Notwithstanding, it is recognized that the number of taps can be increased beyond three and that such modification may further improve the correction capabilities of the circuit. For example, an additional frequency filter can be used to remove half of the sub frequency band of frequency filter 104. The multiple-tap correction filter can be applied to the resulting IQ signals and a coefficient estimator can generate additional sets of tap coefficients from the corrected signals. The use of additional taps can be particularly useful for wide frequency bands of interest and for IQ mismatches that exhibit a strong dependence on frequency.

Figure 2:
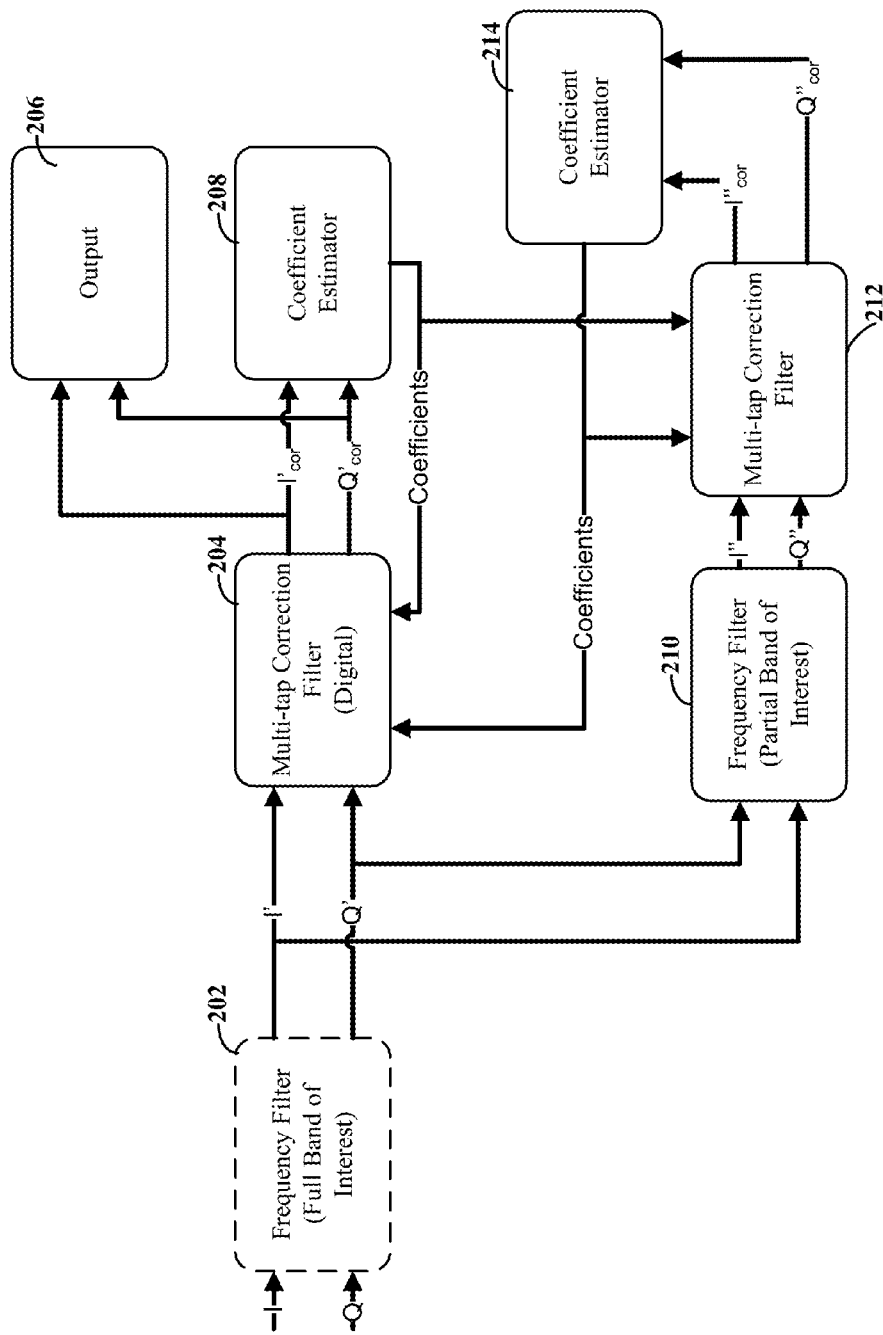
FIG. 2 is a block diagram of apparatus that corrects for mismatches between I and Q signals using parallel correction paths, consistent with embodiments of the present disclosure.

FIG. 2 is a block diagram of apparatus that corrects for mismatches between I and Q signals using parallel correction paths, consistent with embodiments of the present disclosure. The block diagram in FIG. 2 explicitly shows two parallel correction paths that are consistent with the corresponding description from FIG. 1. The frequency filter 202 can optionally be used to provide pre-filtering of the IQ signals (e.g., relative to the entire band of interest) and produces filtered I' and Q' signals.

The first correction path provides the I'Q' signals to a first multiple-tap correction filter 204. The I'$_{cor}$ Q'$_{cor}$ output of the first multiple-tap correction filter 204 can be provided as an output 206 of the apparatus and used for decoding of data within the signals. The output of the first multiple-tap correction filter 204 is also provided to the first coefficient estimator 208. The first coefficient estimator 208 generates a first set of coefficients. The first set of coefficients are optimized relative to the full band of interest. Accordingly, the first set of coefficients can be used as the center tap for both the first multiple-tap correction filter 204 and the second multiple-tap correction filter 212.

The second correction path filters out a portion of the entire band of interest using a frequency filter 210 to produce sub band I"Q" signals. The sub band I"Q" signals are provided to the second multiple-tap correction filter 212. The I"$_{cor}$ Q"$_{cor}$ output of the second multiple-tap correction filter 212 is provided to the second coefficient estimator 214 to produce the second set of coefficients for both the first multiple-tap correction filter 204 and the second multiple-tap correction filter 212. The feedback loop formed by the second coefficient estimator 214 and the second multiple-tap correction filter 212 produces a set of coefficients that attempt to minimize error within only a portion of the full signal band.

Figure 3:
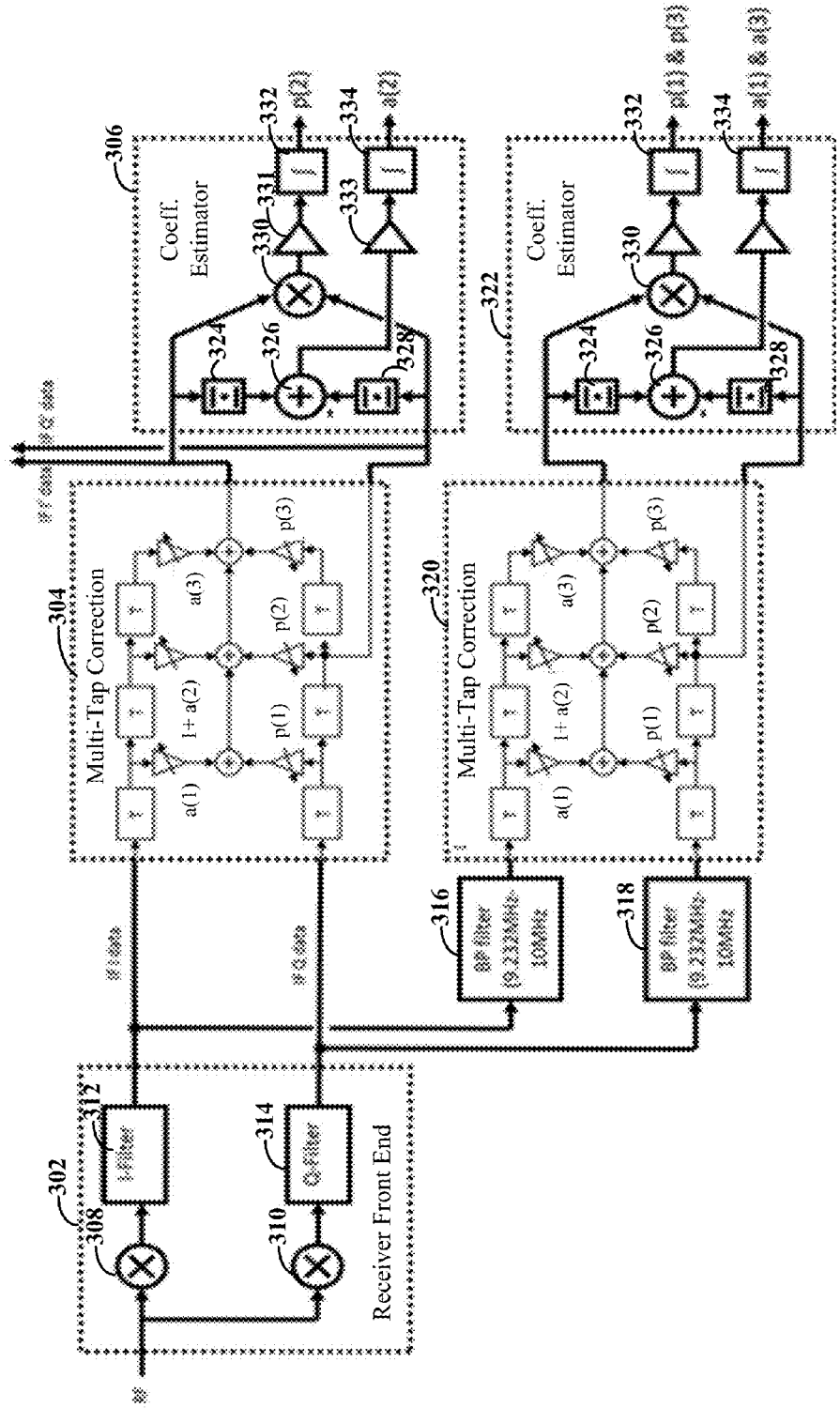
FIG. 3 depicts a functional diagram of a circuit that corrects for mismatches between I and Q signals, consistent with embodiments of the present disclosure.

FIG. 3 depicts a functional diagram of a circuit that corrects for mismatches between I and Q signals, consistent with embodiments of the present disclosure. FIG. 3 provides a more specific example for the components discussed in connection with FIGS. 1 and 2, consistent with certain embodiments. Receiver front end circuitry 302 is depicted as multiplying an incoming RF signal using two multipliers 308 and 310. As depicted, multiplier 308 corresponds to the in-phase (I) signal component and multiplier 310 corresponds to the quadrature-phase (Q) signal component. Although note depicted, the multipliers 308 and 310 are provided with a sine and cosine signal that have a phase difference of 90 degrees. The output of the multipliers are IQ signals at an intermediate frequency (IF). Optional filters 312 and 314 can provide frequency filtering for the IQ signals and can be implemented, for example, using bandpass filters (e.g., SAW filters).

The IP signals are provided directly (with the entire frequency band of interest) to a first multiple-tap correction filter 304. In many instances, an ADC can be used to first convert the analog signals into the digital domain. The first multiple-tap correction filter 304 has three taps (represented by delay components "T"). Each tap provides filtering according to a respective set of coefficients, a(n) and b(n). The coefficients represent an amplitude component, a(n), and a phase component b(n). The output of the first multiple-tap correction filter 304 is a corrected set of I'Q' signals that can be decoded to obtain the data within the received RF signal. The output is also provided to a first coefficient estimator 306.

The first coefficient estimator 306 produces a first set of coefficients that includes an amplitude component a(2) and a phase component p(2). The components 324 and 328 take the absolute value of each of the I' Q' signals. Component (adder) 326 takes the difference between the absolute values. The difference is then integrated using integrator 334 to produce the amplitude coefficient a(2). The phase coefficient is determined by integrating, using integrator 332, a correlation between the I and Q signals, where the correlation is represented by the output of multiplier 330. The relative gains for amplifiers 331 and 333 can be used to set the speed and accuracy of the coefficient tracking (convergence) in the calibration system. The coefficients a(2) and b(2) set a constant correction factor over the IF frequency range.

Bandpass (BP) filters 316 and 318 filter out a portion of the entire frequency band of interest for each of the I and Q signals, respectively. As a non-limiting example, the bandpass filters 316 and 318 can be implemented using a mixer and low-pass filter combination. The depicted example of a bandpass filter has a bandpass of 9.232 MHz to 10 MHz, which corresponds to a 10 MHz IF signal with the full frequency bandwidth of interest being 1.53 MHz. The specific numbers for the bandpass filters are provided as an example and can be modified (e.g., in view of the center frequency and bandwidth of the IF signal).

The second multiple-tap correction filter 320 is configured using the same coefficients as the first multiple-tap correction filter 304. The corrected output is provided to the second coefficient estimator 322, which is configured in the same manner as the first coefficient estimator 306. The set of coefficients generated by the second coefficient estimator 322 are used to set a second set of coefficients for both the first multiple-tap correction filter 304 and the second multiple-tap correction filter 320. In particular, the second coefficient estimator 322 generates amplitude coefficients a(1) and a(3) and phase coefficients p(1) and p(3), which correspond to the first and third taps.

The particular configurations of the multiple-tap correction filters 304 and 320 and of the coefficient estimators 306 and 322 are not meant to be limiting for every embodiment. For instance, the coefficient estimators can use alternative solutions to determine the correlation between the I and Q signals, as is relevant to the generation of the phase coefficients.

Figure 4:
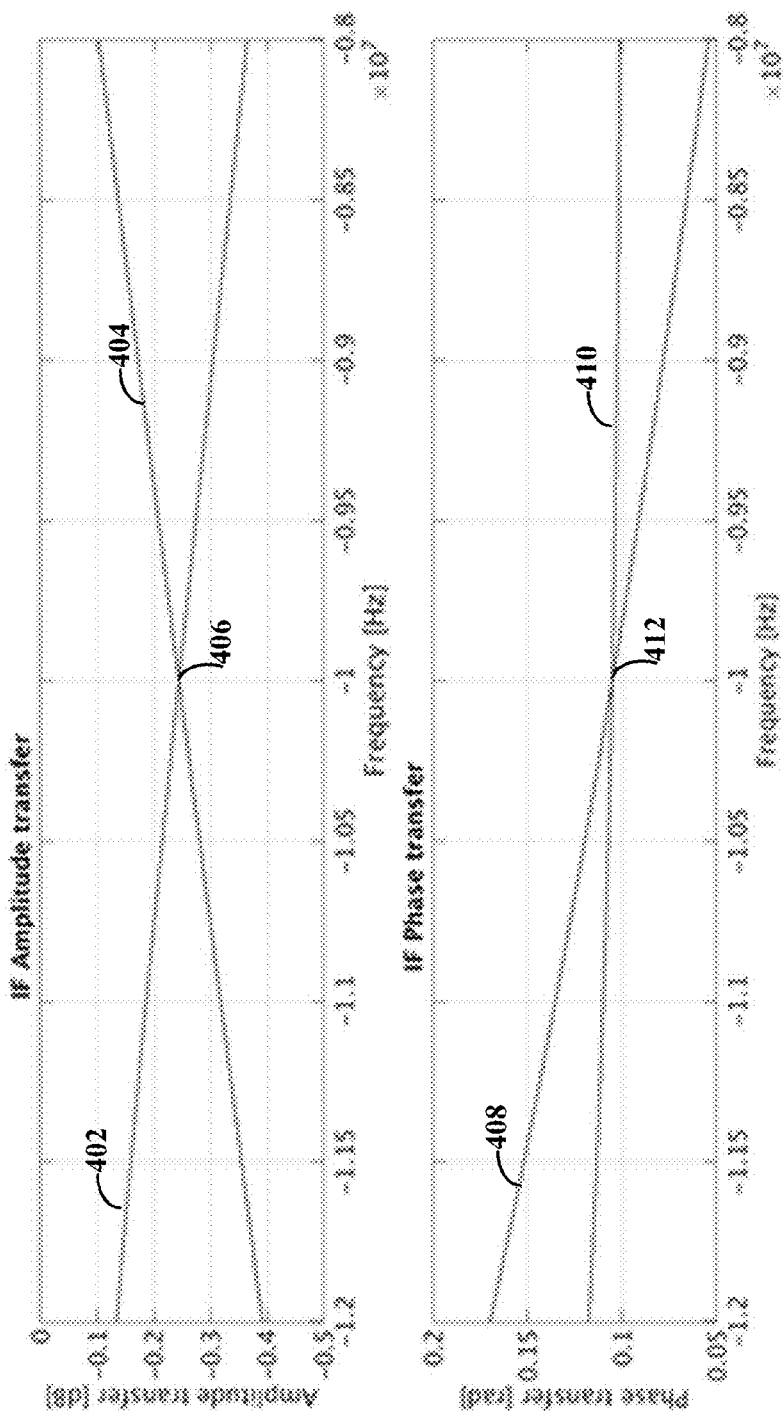
FIG. 4 is a plot of the signal transfer for I and Q components with a single-tap compensation, consistent with embodiments of the present disclosure.

FIG. 4 is a plot of the signal transfer for I and Q components with a single-tap compensation, consistent with embodiments of the present disclosure. The amplitude transfer (upper plot) and the phase transfer (lower plot) correspond to a situation in which the relative IQ mismatch varies across the depicted frequencies (−12 MHz to −0.8 MHz). The depicted frequencies are indicated as being negative, which is a notational convenience sometimes used when representing image frequencies. The corrective filtering from a single-tap compensation is able to correct for phase and amplitude mismatch relative to a particular frequency. The amplitude and phase transfer shows that the difference in I (402, 410) and Q (404, 408) transfer is zero at −10 MHz, as shown by 406 and 412, respectively. Both the amplitude and phase transfers deviate as frequencies diverges from the zero point at −10 MHz.

The relative mismatch is mirrored on either side of the zero point 406, 412. This property can be exploited to reduce the processing to generate coefficients. In particular, the coefficients calculated for one half of the frequency band (either above or below −10 MHz) can be reused for the other half of the frequency band. By setting the coefficients for the outer tap values in this manner, the tilt of the I and Q transfer can be equalized. When the amplitude or phase coefficients are both positive, the transfer gets a negative tilt. When the coefficients are positive, the transfer get a positive tilt.

Figure 5:
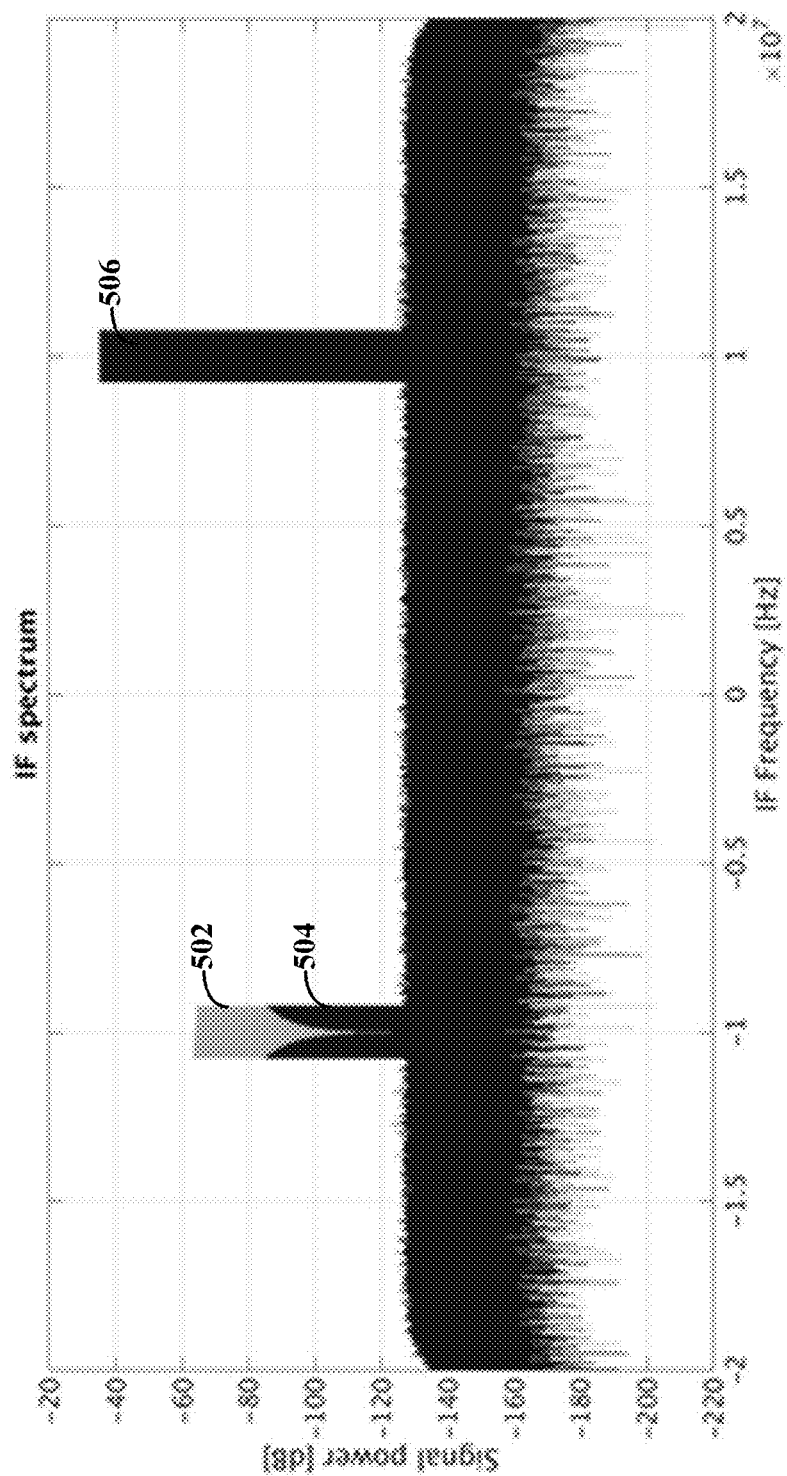
FIG. 5 is a diagram showing signal spectrum for a single-tap compensation, consistent with embodiments of the present disclosure.

FIG. 5 is a diagram showing signal spectrum for a single-tap compensation, consistent with embodiments of the present disclosure. The signal spectrum shown in FIG. 5 is generated using the phase and amplitude transfers from FIG. 4. The portion 502 represents the image signal generated by the IQ mismatch without corrective filtering. The lower shaded portion 504 represents the image signal remaining after filtering using a single tap. The portion 506 shows the frequency components for the original signal. The single-tap correction shows an improvement over no compensation, but the residual image signal increases with the distance from the center point at −10 MHz.

Figure 6:
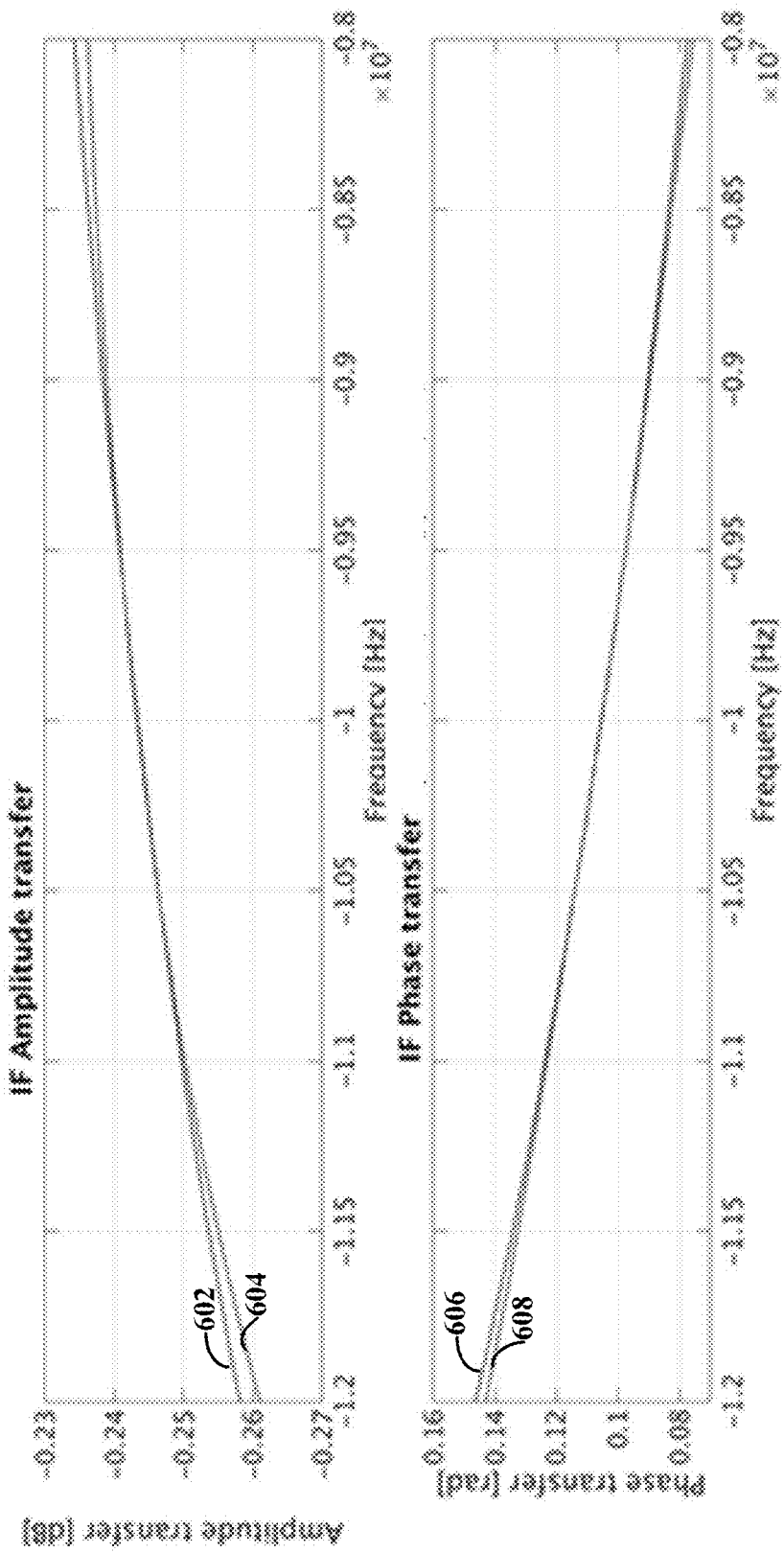
FIG. 6 is a plot of the signal transfer for I and Q components with a three-tap compensation, consistent with embodiments of the present disclosure.

FIG. 6 is a plot of the signal transfer for I and Q components with a three-tap compensation, consistent with embodiments of the present disclosure. The amplitude and phase transfers shown in FIG. 6 are with respect to a three tap correction filter in which the outside tap coefficients are generated relative to a frequency sub band of the full frequency band of interest. The mismatch between the I (604, 608)) and Q (602, 606) signal transfers is well match for the depicted frequency band.

Figure 7:
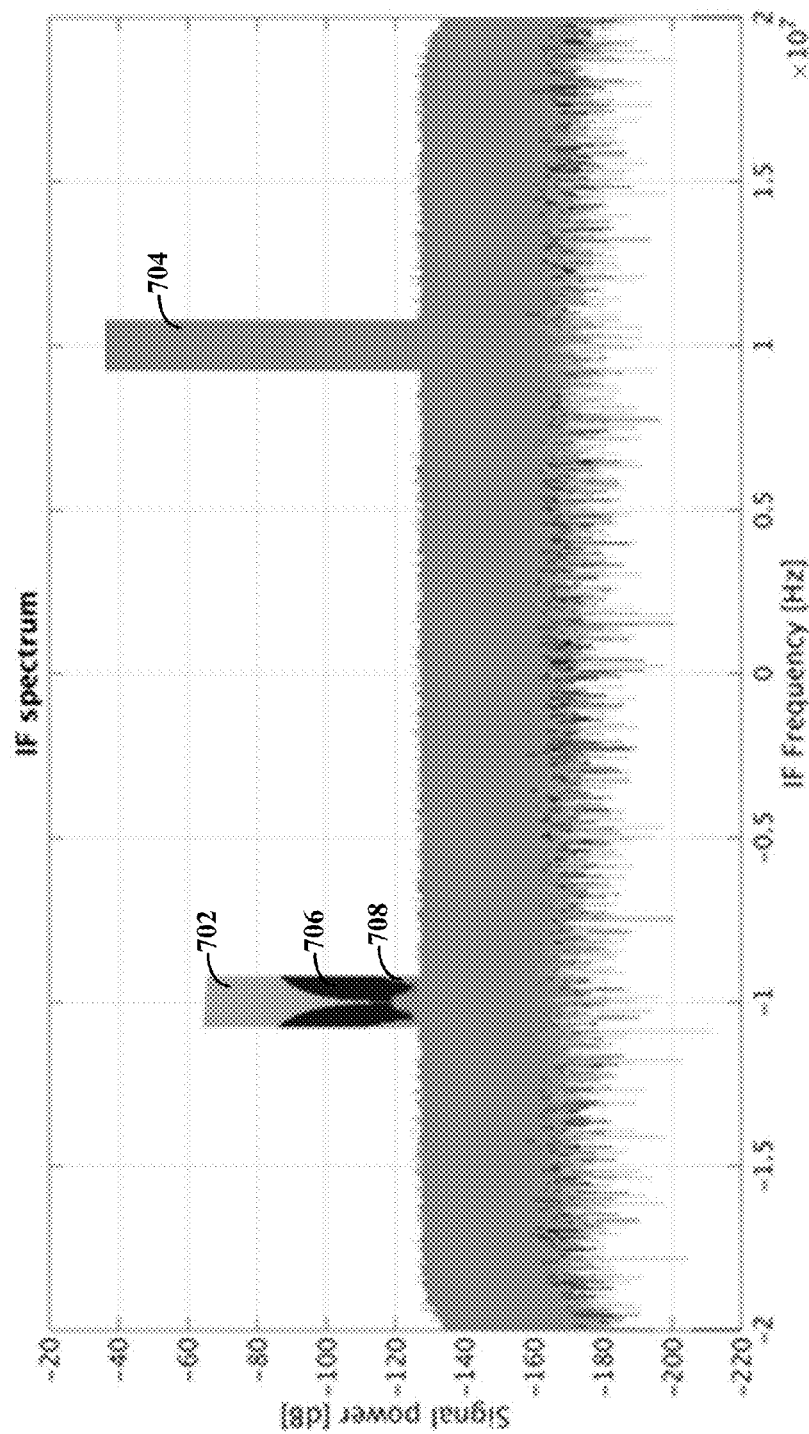
FIG. 7 is a diagram showing signal spectrum for a three-tap compensation, consistent with embodiments of the present disclosure.

FIG. 7 is a diagram showing signal spectrum for a three-tap compensation, consistent with embodiments of the present disclosure. The frequency components at −10 MHz represent a signal image of signal 704 relative to IQ phase and amplitude mismatches. The frequency components identified by 702 show the image without compensation. The frequency components identified by 706 show the image with single-tap compensation. The frequency components indicated by 708 show the image with three-tap compensation, where the outer taps are designed to compensate for frequency dependency of the IQ mismatch, consistent with various embodiments discussed herein.

Figure 8:
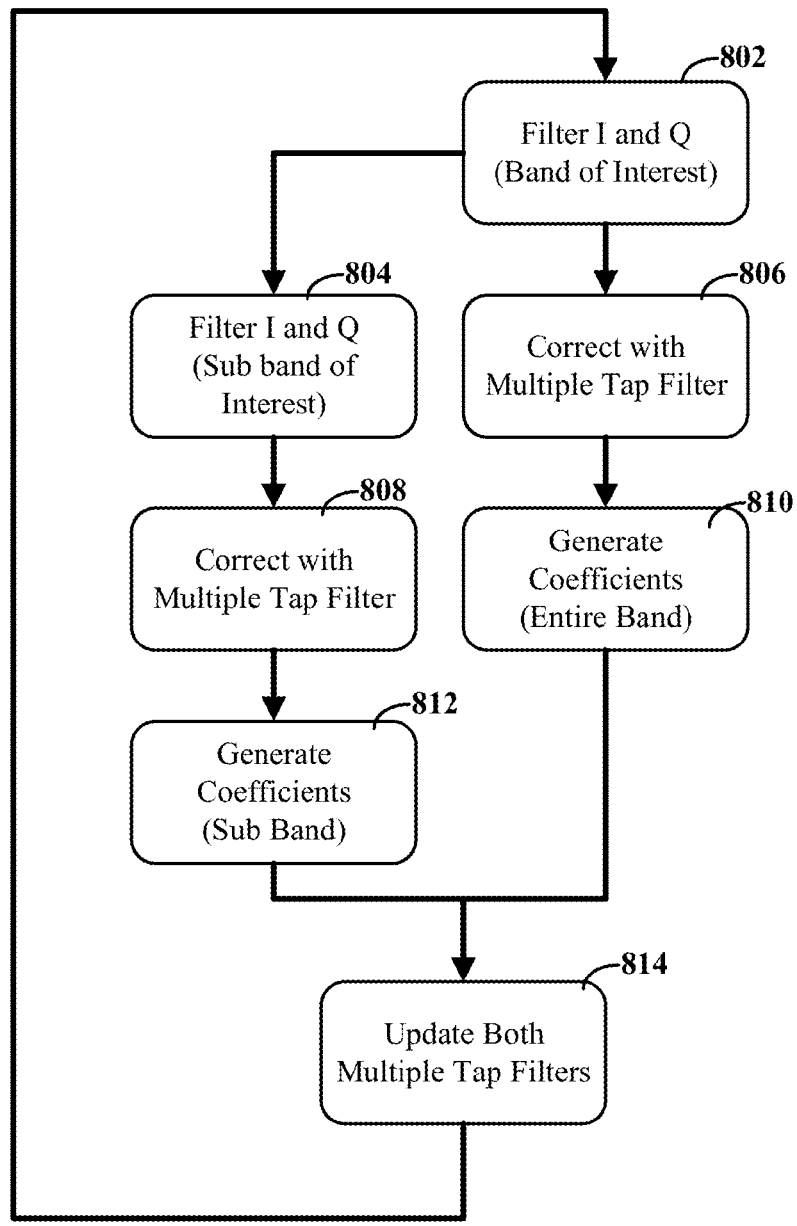
FIG. 8 is a flow diagram for providing IQ mismatch compensation, consistent with embodiments of the present disclosure.

FIG. 8 is a flow diagram for providing IQ mismatch compensation, consistent with embodiments of the present disclosure. The flow diagram begins with the receipt and optional filtering of in-phase (I) signal and a quadrature-phase (Q) signal having a first frequency bandwidth, per block 802. For example, a frequency filter 102 can provide bandpass filtering relative to the full frequency band of interest. The flow diagram shows two separate paths after the receipt and optional filtering. As discussed herein, these paths can be followed in parallel or sequentially depending upon the particular implementation. In the first path, the full frequency band IQ signals are corrected using a multiple-tap correction filter having a plurality of taps, per block 806. The correction can compensate for image components caused by mismatches between I and Q signals (although the filtering can also compensate for image components from other sources). The correction of the I and Q signals is accomplished using sets of coefficients for the plurality of taps. The corrected IQ signals are then used to generate a set coefficients, per block 810. As discussed herein, each set of coefficients may include an amplitude coefficient and a phase coefficient. The set of coefficients are used to update the multiple-tap correction filter from the first path, per block 814. The set of coefficients are also used to update the multiple-tap correction filter from the second path. Consistent with various embodiments, a single multiple-tap correction filter can be reused for each path (e.g., by time interleaving the multiple-tap correction filter between each path).

The second path begins by applying a frequency filter to the I and Q signals, per block 804. The frequency filter removes a portion of the full band of interest. In particular implementations, the frequency filter removes either an upper or lower half of the full band of interest. The filtered IQ signals are then corrected using a multiple-tap correction filter with the plurality of taps and corresponding coefficients, per block 808. Second and third sets of coefficients are generated based upon the output of the multiple-tap correction filter, per block 812. The second and third sets of coefficients are then used to update the multiple-tap correction filter(s), per block 814.

Terms to that indicate orientation, such as upper/lower, left/right, top/bottom and above/below, may be used herein to refer to relative positions of elements as shown in the figures. It should be understood that when the terminology is used for notational convenience, the disclosed structures may be oriented different from the orientation shown in the figures.

The Specification describes and/or illustrates aspects useful for implementing the claimed disclosure by way of various circuits or circuitry which are discussed in the context of terms such as blocks, modules, and tasks. Such circuits or circuitry are used together with other elements. The circuit structure is exemplified through a discussion of the related embodiments and the corresponding structures, steps, functions, operations, activities, etc. For example, in certain of the above-discussed embodiments, one or more illustrated items in this context represent circuits (e.g., CPU circuits, discrete logic circuitry or (semi-)programmable circuits) configured and arranged for implementing these operations/activities, as may be carried out in the approaches shown in the figures. In certain embodiments, one or more computer processing circuits or CPUs are configured by way of memory circuitry that stores software code (program to be executed as a set/sets of instructions) for performing a specific set of operations.

Certain embodiments are directed to a computer program product (e.g., nonvolatile memory device), which includes a machine or computer-readable medium having stored thereon, instructions which may be executed by a computer (or other electronic device) that includes a computer processor circuit to perform these operations/activities. For example, these instructions reflect activities or data flows as may be consistent with the figures, flow charts, and the detailed description.

Based upon the above discussion and illustrations, those skilled in the art will readily recognize that various modifications and changes may be made to the various embodiments without strictly following the exemplary embodiments and applications illustrated and described herein. For example, methods as described in connection with the figures may involve steps carried out in various orders, with one or more aspects of the embodiments herein retained, or may involve fewer or more steps. Such modifications do not depart from the true spirit and scope of various aspects of the disclosure, including aspects set forth in the claims.

What is claimed is:

1. An apparatus to correct for mismatches between an in-phase (I) signal and a quadrature-phase (Q) signal, the I and Q signals having a first frequency band, the apparatus comprising:
   a frequency filter circuit configured to filter the I and Q signals to produce a filtered I and Q output with a second frequency band that is a subset of the first frequency band, wherein the second frequency band falls entirely within the first frequency band and spans less than the first frequency band;
   digital circuitry that includes:
      a multiple tap correction filter having a plurality of taps and configured to generate I and Q output signals by filtering the I and Q signals according to respective sets of coefficients for the plurality of taps;
      a coefficient estimator configured to
         generate, from the I and Q signals having the first frequency band,
         a first set of coefficients for the sets of coefficients; and
         generate, from the filtered I and Q signals having the second frequency band, second and third sets of coefficients for the sets of coefficients.

2. The apparatus of claim 1, wherein each set of coefficients includes a phase component and a gain component, wherein the coefficient estimator is further configured to generate respective phase components by determining a phase correlation between I and Q signals and integrating the determined phase correlation.

3. The apparatus of claim 2, wherein the coefficient estimator is further configured to generate respective gain components by determining an absolute difference in amplitude of I and Q signals and integrating the determined absolute difference.

4. The apparatus of claim 1, wherein the second frequency band is half of the first frequency band, wherein the multiple tap correction filter is configured to provide the I and Q signals having the first frequency band and the I and Q signals having the second frequency band to the coefficient estimator, and provide the I and Q signals having the first frequency band as an output for decoding data within the I and Q signals.

5. The apparatus of claim 4, wherein the coefficient estimator is further configured to generate, from the filtered I and Q signals having the second frequency band, a single phase component and a single gain component that is used for sets of coefficients one both sides of at tap corresponding to the first set of coefficients.

6. The apparatus of claim 1, further comprising an analog-to-digital converter (ADC) circuit configured to convert the I and Q signals to a digital signal that is provided to the frequency filter circuit.

7. The apparatus of claim 6, further comprising a surface acoustic wave filter configured to filter the I and Q signals according to the first frequency band and to provide an output to the ADC.

8. The apparatus of claim 1, wherein the digital circuitry is part of a digital signal processor (DSP), wherein the coefficient estimator is configured to provide the first set of coefficients and the second set of coefficients to the multiple tap correction filter.

9. The apparatus of claim 1, wherein the multiple tap correction filter includes:
a first multiple tap correction filter configured to:
generate I and Q output signals having the first frequency band by filtering the I and Q signals according to respective sets of coefficients for a plurality of taps; and
provide the I and Q signals having the first frequency band to the coefficient estimator, and as an output for decoding data within the I and Q signals;
a second multiple tape correction filter configured to:
generate I and Q output signals having the second frequency band by filtering the I and Q signals according to respective sets of coefficients for a plurality of taps; and
provide the I and Q signals having the second frequency band to the coefficient estimator.

10. The apparatus of claim 9, wherein each of the first and second multiple tap correction filters includes three taps;
the coefficient estimator is further configured to provide the first set of coefficients and the second set of coefficients to the first multiple tap correction filter and the second multiple tap correction filter; and
the first multiple tap correction filter and the second multiple tap correction filter are further configured to use the first set of coefficients as a center tap of the three taps and use the second set of coefficients as first and third taps of the three taps.

11. A method comprising:
receiving an in-phase (I) signal and a quadrature-phase (Q) signal having a first frequency bandwidth;
correcting, using a multiple-tap correction filter having a plurality of taps, mismatches in the I and Q signals by filtering the I and Q signals according to sets of coefficients for the plurality of taps;
filtering the I and Q signals to produce filtered I and Q signals having a second frequency bandwidth that is a subset of the first frequency bandwidth, wherein the second frequency bandwidth falls entirely within the first frequency bandwidth and spans less than the first frequency bandwidth;
correcting, using the multiple-tap correction filter, mismatches in the filtered I and Q signals by filtering the filtered I and Q output according to the respective sets of coefficients;
generating, from the corrected I and Q signals having the first frequency bandwidth, a first set of coefficients for the sets of coefficients; and
generating, from the corrected I and Q signals having the second frequency bandwidth, second and third sets of coefficients for the sets of coefficients.

12. The method of claim 11, wherein each set of coefficients includes a phase component and a gain component.

13. The method of claim 12, further comprising generating respective phase components by determining a phase correlation between respective I and Q signals and integrating the determined phase correlation.

14. The method of claim 12, further comprising generating respective gain components by determining an absolute difference in amplitude of respective I and Q signals and integrating the determined amplitude.

15. The method of claim 11, wherein the second frequency bandwidth is half of the first frequency bandwidth.

16. The method of claim 15, further comprising generating a single phase component and a single gain component for different sets of coefficients on both sides of the first set of coefficients.

17. The method of claim 11, further comprising converting the I and Q signals to digital signals before the filtering to produce the filtered I and Q signals.

18. The method of claim 17, further comprising filtering the I and Q signals using a surface acoustic wave filter configured as a bandpass filter corresponding to the first frequency bandwidth.

19. The method of claim 11, wherein the generating the second set of coefficients occurs during an initialization phase using a coefficient estimator and the generating the first set of coefficients occurs during a subsequent phase using the same coefficient estimator.

20. The method of claim 19, further comprising using time-interleaving to use the coefficient estimator to generate the first and second set of coefficients.

* * * * *